United States Patent
Kawano et al.

(10) Patent No.: US 10,431,617 B2
(45) Date of Patent: Oct. 1, 2019

(54) PHOTOELECTRIC CONVERSION DEVICE AND APPARATUS

(71) Applicant: CANON KABUSHIKI KAISHA, Tokyo (JP)

(72) Inventors: Akihiro Kawano, Yokohama (JP); Yoshiyuki Nakagawa, Yokohama (JP); Masao Ishioka, Oita (JP); Takashi Okagawa, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/905,409

(22) Filed: Feb. 26, 2018

(65) Prior Publication Data

US 2018/0247967 A1    Aug. 30, 2018

(30) Foreign Application Priority Data

Feb. 28, 2017  (JP) ................. 2017-037713

(51) Int. Cl.
| | |
|---|---|
| *H01L 27/146* | (2006.01) |
| *H01L 21/02* | (2006.01) |
| *H01L 21/3115* | (2006.01) |
| *H01L 21/311* | (2006.01) |

(52) U.S. Cl.
CPC .... *H01L 27/14625* (2013.01); *H01L 21/0214* (2013.01); *H01L 21/02211* (2013.01); *H01L 21/02274* (2013.01); *H01L 27/14623* (2013.01); *H01L 27/14636* (2013.01); *H01L 27/14685* (2013.01); *H01L 21/0217* (2013.01); *H01L 21/02164* (2013.01); *H01L 21/3115* (2013.01); *H01L 21/31116* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 2010/0245637 | A1 | 9/2010 | Itonaga |
| 2012/0267745 | A1 | 10/2012 | Tsuji |

FOREIGN PATENT DOCUMENTS

| | | |
|---|---|---|
| JP | 5-190818 A | 7/1993 |
| JP | 8-321595 A | 12/1996 |
| JP | 2001-267544 A | 9/2001 |
| JP | 2004-319896 A | 11/2004 |
| JP | 2004-356269 A | 12/2004 |
| JP | 2006-156611 A | 6/2006 |
| JP | 2006-294773 A | 10/2006 |
| JP | 2007-242697 A | 9/2007 |
| JP | 2009-88415 A | 4/2009 |

(Continued)

*Primary Examiner* — Long Pham
(74) *Attorney, Agent, or Firm* — Canon U.S.A.Inc., IP Division

(57) ABSTRACT

There is provided a photoelectric conversion device in which a distance from a main surface to an inner surface of a first part of a dielectric film is smaller than a distance from the main surface to a top surface of a light shielding member, a distance from the main surface to an outer surface of the first part is smaller than a distance from the main surface to an outer surface of a second part of the dielectric film, an outer surface of a third part inclines to the top surface, a surface of a dielectric member inclines to the top surface, between the dielectric film and the top surface in a normal direction, and the dielectric member has a refractive index lower than a refractive index of the dielectric film.

20 Claims, 4 Drawing Sheets

(56) References Cited

FOREIGN PATENT DOCUMENTS

| | | |
|---|---|---|
| JP | 2010-239076 A | 10/2010 |
| JP | 2011-142234 A | 7/2011 |
| JP | 2011-171575 A | 9/2011 |
| JP | 2012-227478 A | 11/2012 |
| JP | 2013-38383 A | 2/2013 |
| JP | 2013-145917 A | 7/2013 |
| JP | 2016-178148 A | 10/2016 |

PHOTOELECTRIC CONVERSION DEVICE AND APPARATUS

BACKGROUND OF THE INVENTION

Field of the Invention

The present disclosure relates to a photoelectric conversion device.

Description of the Related Art

In a photoelectric conversion device such as a complementary metal-oxide semiconductor (CMOS) image sensor, a dielectric film serving as a passivation film is provided on a light shielding member.

Japanese Patent Application Laid-Open No. 2006-156611 discusses a solid-state imaging device that includes a silicon oxynitride (SiON) film between an interlayer insulation film and a silicon nitride (SiN) film serving as a passivation film. The SiON film has a refractive index that is intermediate between a refractive index of the interlayer insulation film and a refractive index of the SiN film.

Japanese Patent Application Laid-Open No. 2006-294773 discusses a solid-state imaging element in which a passivation film that includes two-layer films of a silicon oxide film and a SiN film is provided on an interlayer insulation film including the uppermost wiring.

SUMMARY OF THE INVENTION

The existing technology has an issue that light use efficiency is deteriorated and stray light occurs due to light reflection on the wiring. Thus, it is difficult to obtain excellent optical characteristics. The present disclosure is directed to a photoelectric conversion device with excellent optical characteristics.

According to an aspect of the present disclosure, a photoelectric conversion device includes a substrate including a photoelectric conversion area in which a plurality of photoelectric conversion portions are arranged along a main surface, a film that is disposed on the photoelectric conversion area, and includes an inner surface on a side of the substrate and an outer surface on a side opposite to the side of the substrate, a first member that is disposed between the film and the photoelectric conversion area, includes a bottom surface located on the side of the substrate, a top surface located on the side opposite to the side of the substrate, and a side surface connecting the bottom surface and the top surface, and includes a light shielding body, a second member disposed at least between the film and the top surface, and a color filter, wherein a distance from the main surface to the top surface is smaller than a distance from the main surface to the color filter, wherein the film includes a first part, a second part, and a third part, the first part overlapping at least a part of each of the photoelectric conversion portions in a normal direction to the main surface of the substrate, the second part overlapping the top surface in the normal direction, and the third part locating between the first part and the second part, wherein a distance from the main surface to the inner surface at the first part is smaller than the distance from the main surface to the top surface, a distance from the main surface to the outer surface at the first part is smaller than a distance from the main surface to the outer surface at the second part, and the outer surface at the third part inclines to the top surface, wherein a front surface of the second member on a side of the film inclines to the top surface, between the film and the top surface in the normal direction, and wherein one or both of the following (A) and (B) are satisfied, (A) the second member has a refractive index lower than a refractive index of the film, and (B) the film and the second member each include a silicon compound, and the second member includes lower nitrogen concentration and/or higher oxygen concentration as compared with the film.

Further features of the present disclosure will become apparent from the following description of exemplary embodiments with reference to the attached drawings.

DESCRIPTION OF THE EMBODIMENTS

Figure 1:
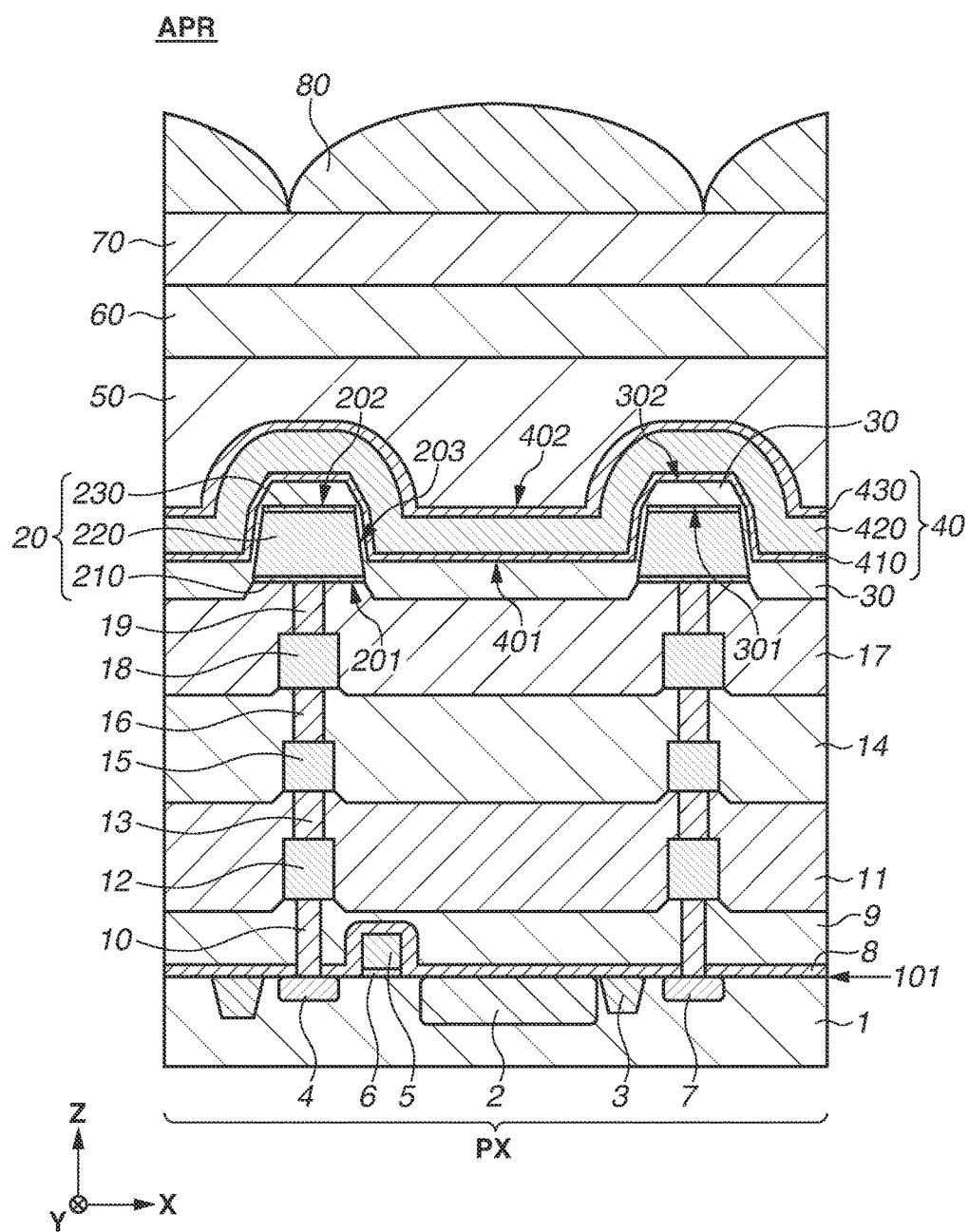
FIG. 1 is a cross-sectional diagram schematically illustrating an example of a photoelectric conversion device.

An exemplary embodiment of the present disclosure will be described below with reference to drawings. In the following description and the drawings, components common to a plurality of drawings are denoted by common reference numerals. Therefore, the common components are described with mutually referring to the plurality of drawings, and description of the components denoted by the common reference numerals is appropriately omitted.

FIG. 1 is a schematic diagram of a front-side illumination photoelectric conversion device APR as an example of the exemplary embodiment. The photoelectric conversion device APR is a semiconductor device including a substrate 1. The photoelectric conversion device APR includes the substrate 1, a dielectric film 40, a light shielding member 20, and a dielectric member 30. The substrate 1 includes a photoelectric conversion area PX in which a plurality of photoelectric conversion portions 2 are arranged along a main surface 101. The dielectric film 40 is disposed above the photoelectric conversion area PX, and includes an inner surface 401 on the substrate 1 side and an outer surface 402 on a side opposite to the substrate 1. The dielectric film 40 includes a dielectric material that includes an inorganic material or an organic material represented by a silicon compound, and serves as an insulation film. The dielectric film 40 is a light transmission film including optical transparency to allow the photoelectric conversion portion 2 to receive light. The light shielding member 20 is disposed between the dielectric film 40 and the photoelectric conversion area PX. The light shielding member 20 is formed of a light shielding material such as a metal and a metal compound, and also serves as an electroconductive member. The light shielding member 20 includes a bottom surface 201 located on the substrate 1 side and a top surface 202 located on a side opposite to the substrate 1. The light shielding member 20 has a pattern to allow openings to be provided above the photoelectric conversion portion 2. Accordingly, the light shielding member 20 includes a side surface 203 that connects the bottom surface 201 and the top surface 202. The side surface 203 defines the openings of the light shielding member 20. The dielectric member 30 is disposed at least between the dielectric film 40 and the light shielding member 20. The dielectric member 30 includes a dielectric material such as an organic material and a silicon compound, and serves as an insulation member. The dielectric member 30 includes a front surface 302 on the dielectric film 40 side, and an opposite surface 301 on a side (substrate 1 side) opposite to the surface 302. The dielectric member 30 spreads along the inner surface 401 of the dielectric film 40.

The main surface 101 of the substrate 1 includes light receiving surface of the photoelectric conversion portion 2, and is parallel to the light receiving surfaces. In a case where the substrate 1 is a semiconductor substrate, the main surface 101 may form an interface with an insulator. Description is given while in-plane directions X and Y in which the main surface 101 of the substrate 1 spreads are regarded as an X direction and a Y direction in coordinates, and a normal direction Z to the main surface 101 (direction perpendicular to the main surface 101) is regarded as a Z direction in the coordinates. The X direction, the Y direction, and the Z direction are orthogonal to one another. In the following description, a distance from the main surface 101 of the substrate 1 to each of a film, a member, and a part or a surface thereof is described. The distance from the main surface 101 can be rewarded as a height of each of the film, the member, and the part or the surface thereof, with the main surface 101 as a reference. A thickness of each of the film, the member, and the part thereof is a dimension of each of the film, the member, and the part thereof relative to the main surface 101 of the substrate 1 in the normal direction Z. Further, a width of each of the film, the member, and the part or the surface thereof is a dimension of each of the film, the member, and the part or the surface thereof relative to the main surface 101 of the substrate 1 in the in-plan directions X and Y.

The dielectric film 40 is provided on the light shielding member 20 via the dielectric member 30$n$. The dielectric member 30 is also provided between the dielectric film 40 and an interlayer insulation film 17. A planarization film 50, color filter 60, a planarization film 70, and a microlens 80 are provided in this order on the dielectric film 40. The planarization film 50, the color filters 60, the planarization film 70, and the microlens 80 each are formed of resin. The planarization film 50 includes a non-flat surface along the outer surface 402 and a flat surface on side opposite to the non-flat surface. It is sufficient for the flat surface of the planarization film 50 to be flatter than the non-flat surface. A color filter array in which the color filters 60 of a plurality of colors are arranged is disposed on the flat surface of the planarization film 50. The dielectric film 40 is used as a passivation film to prevent contamination from the resin members and infiltration of moisture through the resin members. Light entering through the microlens 80 is received by the substrate 1 through the dielectric film 40.

The present exemplary embodiment is to improve optical characteristics of the photoelectric conversion device APR with use of behavior of light caused by difference of the refractive indexes between the dielectric member 30 and the dielectric film 40. The dielectric member 30 preferably has a refractive index lower than a refractive index of the dielectric film 40. The dielectric film 40 and the dielectric member 30 each preferably contain a silicon compound. In a case where the dielectric film 40 and the dielectric member 30 each contain the silicon compound, the dielectric member 30 preferably includes the nitrogen concentration lower than the nitrogen concentration of the dielectric film 40. In the case where the dielectric film 40 and the dielectric member 30 each contain the silicon compound, the dielectric member 30 also preferably includes oxygen concentration higher than oxygen concentration of the dielectric film 40. In the case where the dielectric film 40 and the dielectric member 30 each contain the silicon compound, the dielectric member 30 also preferably includes the argon concentration higher than the argon concentration of the dielectric film 40. Preferably, the dielectric film 40 and the dielectric member 30 each contain the silicon compound, the dielectric member 30 includes the nitrogen concentration lower than the nitrogen concentration of the dielectric film 40, and the dielectric member 30 also includes the oxygen concentration higher than the oxygen concentration of the dielectric film 40. The refractive index of the silicon compounds tends to become higher as the nitrogen concentration is higher, and to become lower as the oxygen concentration and/or the argon concentration is higher.

The silicon compound satisfying the above-described relationship of the nitrogen concentration, the oxygen concentration, and/or the argon concentration has a preferable material combination to obtain appropriate relationship of the refractive indexes between the dielectric member 30 and the dielectric film 40. In comparison of the concentration of a specific element between the two materials, the specific element may not be contained in the material having the lower concentration. In other words, the lower concentration of the specific element encompasses that the concentration of the specific element is zero. The silicon concentration, the nitrogen concentration, the oxygen concentration, and the argon concentration can be analyzed through scanning electron microscopy-energy dispersive X-ray spectroscopy (SEM-EDX), transmission electron microscopy-energy dispersive X-ray spectroscopy (TEM-EDX), or secondary ion mass spectrometry (SIMS).

Figure 2:
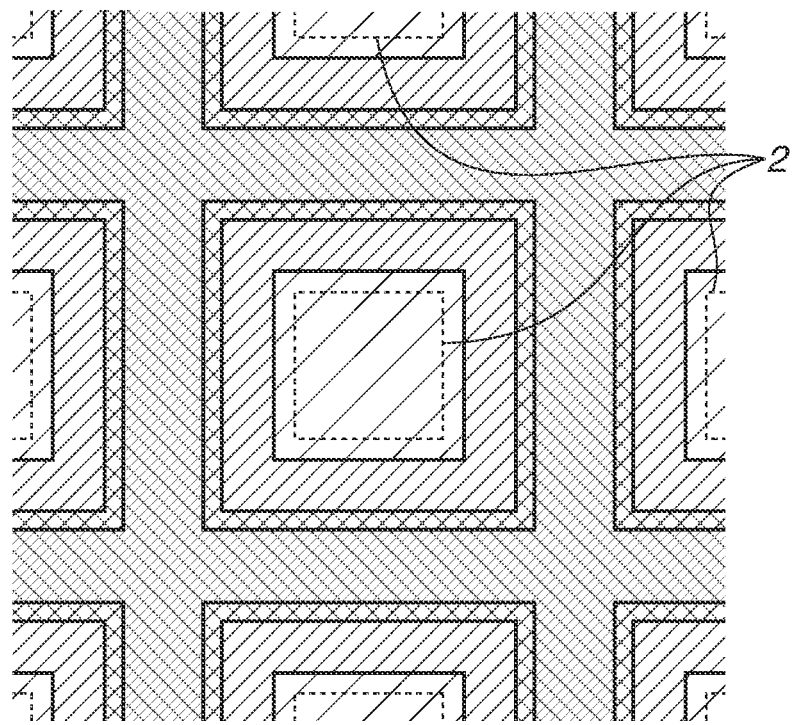
FIG. 2 is a plan diagram schematically illustrating an example of the photoelectric conversion device.
Figure 2:
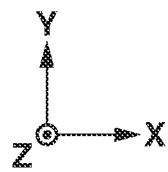
Figure 3:
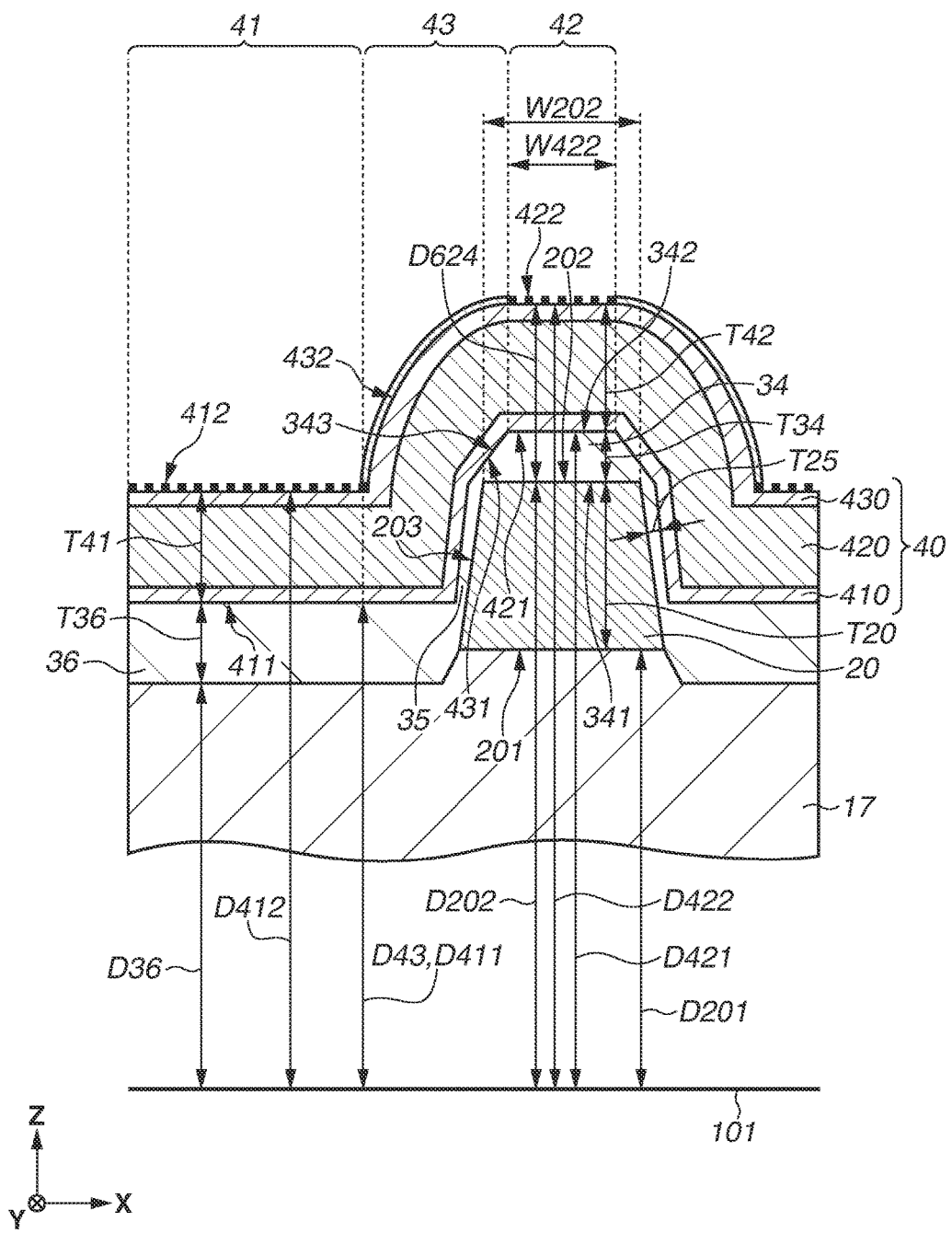
FIG. 3 is a cross-sectional diagram schematically illustrating an example of the photoelectric conversion device.

The structure near the light shielding member 20 in the photoelectric conversion area will be described in detail. FIG. 2 illustrates the dielectric film 40 in a plane view with respect to the normal direction Z, as a plan view. FIG. 2 is a plan view transparently illustrating the dielectric film 40 so as to include the photoelectric conversion portions 2 and the light shielding member 20 in the photoelectric conversion device APR. In FIG. 2, positional relationship between the light shielding member 20 and each part of the dielectric film 40 is illustrated by overlapped hatchings. Overlapping of two members in the normal direction Z is the same as overlapping of two members in a plan view with respect to the normal direction Z. FIG. 3 is a cross-sectional view of a part including the dielectric film 40 and the light shielding member 20 in the photoelectric conversion device APR in an enlarged manner.

As illustrated in FIG. 2, the dielectric film 40 includes a first part 41, a second part 42, and a third part 43 in a direction in which the dielectric film 40 extends. The direction in which the dielectric film 40 extends is along the in-plan directions X and Y in a macroscopic view. For example, the first part 41 and the second part 42 extend along the in-plane directions X and Y, and the third part 43 includes a part extending in the normal direction Z in a microscopic view. The first part 41 overlaps at least a part of each of the photoelectric conversion portions 2 in the normal direction Z to the main surface 101 of the substrate 1. The second part 42 overlaps at least a part of the light shielding member 20 in the normal direction Z. The third part 43 is located between the first part 41 and the second part 42 so as to connect the first part 41 and the second part 42 to each other. It may be understood from FIG. 2 that the third part 43 is located between the first part 41 and the second part 42 in a plan view with respect to the normal direction Z. Further, it may be understood from FIG. 3 that the third part 43 is located between the first part 41 and the second part 42 in a direction inclined to the normal direction Z. The inner surface 401 of the dielectric film 40 is configured of inner surfaces of the respective parts of the dielectric film 40. In other words, the inner surface 401 of the dielectric film 40 is configured of an inner surface 411 of the first part 41, an inner surface 421 of the second part 42, and an inner surface 431 of the third part 43. Likewise, the outer surface 402 of the dielectric film 40 is configured of an outer surface 412 of the first part 41, an outer surface 422 of the second part 42, and an outer surface 432 of the third part 43. In FIG. 3, the outer surface 412 and the outer surface 422 are indicated by dotted lines, and the outer surface 432 is indicated by hatching.

The first part 41 covers the light receiving surface of the photoelectric conversion portion 2. Therefore, the inner surface 411 of the first part 41 faces the light receiving surface of the photoelectric conversion portion 2. The first part 41 overlaps at least a part of each of the photoelectric conversion portion 2 in the normal direction Z. The second part 42 covers the top surface 202 of the light shielding member 20. Therefore, the inner surface 421 of the second part 42 faces the top surface 202 of the light shielding member 20. The third part 43 covers the side surface 203 of the light shielding member 20. In other words, the inner surface 431 of the third part 43 faces the side surface 203 of the light shielding member 20.

A distance D411 from the main surface 101 to the inner surface 411 of the first part 41 is preferably smaller than a distance D202 from the main surface 101 to the top surface 202. Further, a distance D412 from the main surface 101 to the outer surface 412 of the first part 41 is preferably smaller than a distance D422 from the main surface 101 to the outer surface 422 of the second part 42. As described above, the first part 41 is brought close to the photoelectric conversion portion 2, which makes it possible to guide light above the top surface 202 of the light shielding member 20 to below the top surface 202 of the light shielding member 20. This makes it possible to suppress occurrence of stray light due to light reflection on the top surface 202 of the light shielding member 20.

The outer surface 432 of the third part 43 is inclined to the top surface 202. Therefore, light that travels from above the first part 41 toward the third part 43 can be reflected toward the first part 41 by the inclined outer surface 432. This makes it possible to improve light use efficiency and to reduce stray light. An inclination angle of the outer surface 432 to the top surface 202 is an angle formed by a tangent to the outer surface 432 and the top surface 202, and is larger than 0 degrees and smaller than 90 degrees. In other words, the inclination angle of the outer surface 432 to the top surface 202 is an acute angle. In the present exemplary embodiment, the inclination angle of the outer surface 432 is continuously varied within a range of 0 degrees to 90 degrees. The outer surface 432 of the third part 43 is preferably inclined to the top surface 202 at a position overlapping the light shielding member 20 in the normal direction Z, in terms of improvement of the optical characteristics.

The dielectric member 30 at least includes a fourth part 34 that is located between the inner surface 401 of the dielectric film 40 and the top surface 202 in the normal direction Z. The fourth part 34 includes, on the front surface 302, an inclined region 343 inclining to the top surface 202. The inclined region 343 of the front surface 302 is located between the dielectric film 40 and the top surface 202 in the normal direction Z. The inclined region 343 faces the outer surface 432 of the third part 43. Facing of two surfaces indicates that a normal to one of the surfaces intersects the other surface, and the one surface intersects a normal to the other surface. The inclined region 343 of the fourth part 34 spreads along the inner surface 401 of the dielectric film 40. Therefore, the inner surface 431 of the third part 43 faces the outer surface 432 of the third part 43 and inclines to the top surface 202.

An inclination angle of the inclined region 343 to the top surface 202 is an angle formed by a tangent to the inclined region 343 and the top surface 202, and is larger than 0 degrees and smaller than 90 degrees. In other words, the inclination angle of the inclined region 343 to the top surface 202 is an acute angle. In the present exemplary embodiment, the inclination angle of the inclined region 343 is within a range of 30 degrees to 60 degrees but may be continuously varied within a range of 0 degrees to 90 degrees.

Light enters from the outer surface 432 to the third part 43 depending on an incident angle of the light, and the light may become stray light through reflection on the top surface 202. In the present exemplary embodiment, the light entering the third part 43 in the above-described manner is reflected by the inner surface 431 of the third part 43 or the inclined region 343 of the dielectric member 30, which suppresses light reflection on the top surface 202 and improves the light use efficiency. In the present exemplary embodiment, the dielectric film 40 and the dielectric member 30 come into contact with each other and the dielectric film 40 and the dielectric member 30 form an interface. The interface is formed by the inner surface 431 and the inclined region 343 of the surface 302. In the present exemplary embodiment, however, another layer may be disposed between the dielectric film 40 and the dielectric member 30. Likewise, another layer may be disposed between the light shielding member 20 and the dielectric member 30.

The outer surface 422 of the second part 42 may include a flat region flattened along the top surface 202. The outer surface 422 may not include the flat region and may be formed of only the inclined region; however, the fact that the outer surface 422 includes the flat region is advantageous to increase the inclination angle of the outer surface 432 of the third part 43 to the top surface 202. The second part 42 is, out of the dielectric film 40, a part that overlaps the top surface 202 and configures a region (top) of the outer surface 402 farthest from the main surface 101 and/or the top surface 202. Typically, the farthest region of the outer surface 422 of the second part 42 configures the flat region as with the present exemplary embodiment.

Likewise, the surface 302 of the fourth part 34 of the dielectric member 30 may include a flat region 342 flattened along the top surface 202, in addition to the inclined region 343. A width 422 of the flat region 342 is smaller than a width W202 of the top surface 202. The surface 302 of the fourth part 34 may not include the flat region 342 and may be configured of only the inclined region 343; however, the fact that the fourth part 34 includes the flat region 342 is advantageous to increase the inclination angle of the inclined region 343 to the top surface 202.

A distance D43 (equivalent to distance D411) from the main surface 101 to the third part 43 is preferably larger than a distance D201 from the main surface 101 to the bottom surface 201 (D43>D20). This makes it possible to obtain a form in which the side surface 203 of the light shielding member 20 is extended to the substrate 1 side of the third part 43. The light output from the third part 43 is shielded by the light shielding member 20 and is also reflected by the side surface 203 of the light shielding member 20. This makes it possible to reduce stray light and to improve light use efficiency.

The distance D412 from the main surface 101 to the outer surface 412 of the first part 41 is preferably smaller than a distance D421 from the main surface 101 to the inner surface 421 of the second part 42 (D412<D421). The distance D421 is substantially equal to a sum of the distance D201, a thickness T20 of the light shielding member 20 and a thickness T34 of the fourth part 34 Reducing the distance D412 makes it possible to increase the inclination angle of the outer surface 432, which allows light use efficiency to be improved. A difference between the distance D412 from the main surface 101 to the outer surface 412 of the first part 41 and the distance D202 from the main surface 101 to the top surface 202 is preferably smaller than a half of a thickness T20 of the light shielding member 20 (D412−D202<T20/2). In the present exemplary embodiment, the difference between the distance D202 and the distance D412 is substantially zero. In other words, the outer surface 412 of the first part 41 is located at substantially the same height as the top surface 202 of the light shielding member 20. This makes it possible to form the inclined outer surface 432 in an arc shape that is suitable to control light refraction by the third part 43.

A thickness T42 of the second part 42 in the normal direction Z is preferably smaller than the thickness T20 of the light shielding member 20. A distance D624 from the top surface 202 to the outer surface 422 of the second part 42 is preferably smaller than the thickness T20 of the light shielding member 20 in the normal direction Z. The distance D624 from the top surface 202 to the outer surface 422 of the second part 42 is substantially equal to a sum of a thickness T42 of the second part 42 and a thickness T34 of the fourth part 34 (D624=T42+T34). The thickness T34 of the fourth part 34 is preferably equal to or larger than one-fourth of the width W202 of the top surface 202 (T34≥W202/4). The thickness T34 of the fourth part 34 in the normal direction Z is preferably smaller than the thickness T42 of the second part 42 in the normal direction Z. The thickness T42 and the thickness T34 have such relationship, which makes it possible to optimize the height of the third part 43 and the angle of each of the outer surface 432 and the inclined region 343 for improvement of the optical characteristics. Further, when the fourth part 34 of the dielectric member 30 has an appropriately large thickness T34, the inclined region 343 is increased in length, which may improve light use efficiency. If the thickness T34 of the fourth part 34 is excessively large, however, the height of the second part 42 and the height of the third part 43 are increased, which deteriorates oblique incidence characteristics. Accordingly, the above-described range is preferably adopted in terms of both of light use efficiency and oblique incidence characteristics.

The dielectric member 30 may include, in addition to the fourth part 34, a fifth part 35 that is located between the side surface 203 of the light shielding member 20 and the third part 43 in the in-plane direction X orthogonal to the normal direction Z. A thickness T25 of the fifth part 35 in a direction perpendicular to the side surface 203 is preferably smaller than the thickness T34 of the fourth part 34 in the normal direction Z. The thickness T34 of the fourth part 34 in the normal direction Z is preferably larger than twice a distance from the side surface 203 to the inner surface 431 of the third part 43. In the case where the dielectric film 40 and the dielectric member 30 form the interface, the distance from the side surface 203 to the inner surface 431 of the third part 43 is equivalent to the thickness T25 (T34>T25×2). The dielectric member 30 may include, in addition to the fourth part 34, a sixth part 36 that is located between the first part 41 and the photoelectric conversion portion 2. The sixth part 36 includes, out of the dielectric member 30, a part that is located between the third part 43 and the substrate 1 in the normal direction Z, and the part is connected to the fifth part 35. The thickness T25 of the fifth part 35 in the direction perpendicular to the side surface 203 is preferably smaller than a thickness T36 of the sixth part 36 in the normal direction Z. The thickness T25 of the fifth part 35 in the direction perpendicular to the side surface 203 is preferably smaller than a half of the thickness T36 of the sixth part 36 in the normal direction Z (T25<T36/2). Decreasing the thickness T25 of the fifth part 35 in the above-described manner makes it possible to suppress increase of the width of the third part 43, which allows light use efficiency to be improved. A distance from the main surface 101 to the sixth part 36 is preferably smaller than the distance D201 from the main surface 101 to the bottom surface 201. This makes it possible to suppress increase of the distance D401 from the main surface 101 to the inner surface 401 of the first part 41, and to suppress occurrence of stray light even if the thickness T36 of the sixth part 36 is increased.

Now, more detailed configuration of the photoelectric conversion device APR will be described. The photoelectric conversion portion 2 configured as a photodiode, a detection portion 4 configuring floating node, and a source-drain region 7 of an amplification transistor, a reset transistor, and the like are disposed in the substrate 1. The photoelectric conversion portion 2 is disposed in the substrate 1 in such a manner that a charge accumulation region of the photoelectric conversion portion 2 is separated from the main surface 101 of the substrate 1 (light receiving surface of photoelectric conversion portion 2). Accordingly, the photoelectric conversion portion 2 serve as embedded photodiodes. In a case where the photoelectric conversion portion 2 output electrons as signal charges, surface separation regions as p-type semiconductor regions are provided between the charge accumulation regions as n-type semiconductor regions and the main surface 101 of the substrate 1, and the surface separation region respectively configures the light receiving surfaces. Further, element separation portions 3 each including an insulator such as a strong topological insulator (STI) and local oxidation of silicon (LOCOS) are disposed in the substrate 1. A gate electrode 5 is disposed on the substrate 1 via the gate insulation film 6. The gate electrode 5 functions as a transfer transistor. An insulation film 8 is provided so as to cover the gate electrode 5.

The gate electrode 5 and the insulation film 8 form an interface with the main surface 101 of the substrate 1. An interlayer insulation film 9 is provided on the insulation film 8. A contact plug 10 penetrating through the interlayer insulation film 9 is provided. The contact plug 10 is connected to the corresponding detection portion 4 that is a drain of the transfer transistor, and the corresponding source-drain region 7.

A multilayer wiring structure that includes a wiring layer, a plug, and an interlayer insulation film is provided between the substrate 1 and the dielectric film 40. A first wiring layer 12 that includes a plurality of electroconductive patterns is provided on the interlayer insulation film 9. The plurality of electroconductive patterns are respectively connected to the plurality of contact plugs 10. A second wiring layer 15 is provided on the first wiring layer 12 via an interlayer insulation film 11. The first wiring layer 12 and the second wiring layer 15 are connected to each other through a via-plug 13. Likewise, an interlayer insulation film 14, a via-plug 16, a third wiring layer 18, an interlayer insulation film 17, a via-plug 19, and the light shielding member 20 are provided on the second wiring layer 15. The light shielding member 20 also functions as a wiring layer (fourth wiring layer)

The light shielding member 20 may include a barrier metal portion 210, an electroconductive portion 220, and a barrier metal portion 230. The electroconductive portion 220 is located between the barrier metal portion 210 and the barrier metal portion 230 in the normal direction Z. The barrier metal portion 210 configures the bottom surface 201, the barrier metal portion 230 configures the top surface 202, and the electroconductive portion 220 configures the side surface. The barrier metal portion 210 may be a single-layer film of a titanium layer or a titanium nitride layer, or may have a stacked-layer structure including a titanium layer and a titanium nitride layer. A thickness of the barrier metal portion 210 is 20 nm to 100 nm, preferably about 20 nm to about 70 nm. The electroconductive portion 220 includes an aluminum layer or an aluminum alloy layer. As the aluminum alloy, an alloy of aluminum and copper (AlCu) and an alloy of aluminum and silicon (AlSi) are typically used. It is necessary for the electroconductive portion 220 to have a thickness enough to satisfy light shielding performance, and the thickness is, for example, about 300 nm to 1200 nm. The barrier metal portion 230 has a single-layer structure of a titanium nitride layer, and has a thickness of 10 nm to 60 nm, preferably about 20 nm to 50 nm. The barrier metal portion 230 may be a stacked body of a titanium layer and a titanium nitride layer as with the barrier metal portion 210. The barrier metal portion 230 may have a thickness smaller than the thickness of the barrier metal portion 210. A width of the barrier metal portion 230 is equal to the width W202 of the top surface 202. It is necessary that the width W202 has a thickness necessary for light shielding performance of each pixel, and the width W202 is, for example, about 500 nm to 900 nm. As described above, the bottom surface 201 and the top surface 202 of the light shielding member 20 each are formed of titanium or a titanium compound, and the side surface 203 of the light shielding member 20 is formed of aluminum. The top surface 202 is formed of titanium or a titanium compound, which makes it possible to reduce optical reflectance of the top surface 202 as compared with a case where the top surface 202 is formed of aluminum. Accordingly, it is possible to suppress stray light.

The dielectric film 40 of the present example is a multi-layer film in which the plurality of dielectric layers are stacked; however, the dielectric film 40 may be a single-layer film including a single dielectric layer. Each of the plurality of dielectric layers configuring the multilayer film preferably has a refractive index higher than the refractive index of the dielectric member 30. The dielectric film 40 of the present example is the multilayer film that includes a dielectric layer 410 and a dielectric layer 420 larger in thickness than the dielectric layer 410, and the dielectric layer 410 configures the inner surface 401. Further, the dielectric film 40 of the present example is the multilayer film further including a dielectric layer 430 smaller in thickness than the dielectric layer 420, and the dielectric layer 430 configures the outer surface 402. In other words, the dielectric layer 420 is located between the dielectric layer 430 and the dielectric layer 410. The dielectric film 40 includes the dielectric layer 410 as a silicon oxynitride layer, the dielectric layer 420 as a silicon nitride layer, and the dielectric layer 430 as a silicon oxynitride layer. Therefore, the dielectric member 30 includes the nitrogen concentration lower than the nitrogen concentration of the dielectric film 40, and the dielectric member 30 includes oxygen concentration higher than oxygen concentration of the dielectric film 40. The dielectric layer 420 may be a silicon oxynitride layer, or the dielectric member 30 may be a silicon oxynitride layer. The dielectric layer 410 as the silicon oxynitride layer has a refractive index of about 1.7 to 1.8, and a thickness of 30 nm to 120 nm, preferably 60 nm to 100 nm. The dielectric layer 420 as the silicon nitride layer has a refractive index of about 1.9 to 2.1, and a thickness of 100 nm to 1000 nm, preferably about 300 nm to 600 nm. The dielectric layer 430 as the silicon oxynitride layer has a refractive index of about 1.7 to 1.8, and a thickness of 40 nm to 200 nm, preferably about 60 nm to 100 nm. The thicknesses of the respective dielectric layers 410, 420, and 430 of the dielectric film 40 are the thicknesses at the first part 41. The dielectric member 30 of the present example is a single-layer film of a silicon oxide layer, and has a refractive index of about 1.4 to about 1.6, and a thickness of 100 nm to 500 nm, preferably 200 nm to 300 nm. The thickness of the dielectric member 30 is the thickness at the fourth part 34 or the sixth part 36.

A method of forming the light shielding member 20, the dielectric member 30, and the dielectric film 40 will be described. The via-plug 19 is formed in the interlayer insulation film 17 on the substrate 1 with use of a multilayer wiring process. A light shielding film that is a stacked-layer film of a titanium barrier metal layer, an aluminum electroconductive layer, and a titanium barrier metal layer is formed on the interlayer insulation film 17. The light shielding film is etched with use of an appropriate mask, to perform patterning as the light shielding member 20. At this time, the interlayer insulation film 17 in a region where the light shielding member 20 is not formed is over-etched to form a concave part in the interlayer insulation film 17.

The dielectric member 30 is formed on the light shielding member 20. A high density plasma-chemical vapor deposition (HDP-CVD) method is suitably used for formation of the dielectric member 30. Plasma density in the high density plasma CVD method may be, for example, $10^{11}$ to $10^{13}/cm^3$. Silane-based gas can be used as material gas of the dielectric member 30. Further, film formation temperature at the time of the formation of the dielectric member 30 can be set to 400° C. to 450° C. The plasma density and components of the process gas in the high density plasma CVD method are adjusted to generate sputtering and deposition at a time at the time of the formation of the dielectric member 30. As a result, a part of the formed dielectric member 30 covering a corner between the top surface 202 and the side surface 203 of the light shielding member 20 is etched through sputtering. This allows the surface 302 of the dielectric member 30 to include the inclined region 343 on the top surface 202. The deposition is caused by the reaction of oxygen-containing gas and silicon-containing gas such as silane-based gas, and the sputtering is caused by ionized argon. The argon used in the sputtering is taken into the dielectric member 30. Therefore, the dielectric member 30 may contain argon. Further, performing sputtering of the dielectric member 30 on the side surface 203 of the light shielding member 20 at the time of the formation of the dielectric member 30 makes it possible to reduce the thickness T25. Further, as described above, forming the concave part in the interlayer insulation film 17 makes the distance D36 smaller than the distance D202.

The dielectric film 40 is formed on the dielectric member 30 by a normal plasma CVD method. Plasma density in the normal plasma CVD method may be, for example, $10^8$ to $10^{11}/cm^3$. The dielectric film 40 is isotropically formed on a base formed by the dielectric member 30 (and interlayer insulation film 17 and light shielding member 20) by the normal plasma CVD method. This allows the dielectric film 40 to include the outer surface 432 that inclining to face the inclined surface of the dielectric member 30. Unlike the formation of the dielectric member 30 described above, occurrence of sputtering is preferably prevented as much as possible in the formation of the dielectric film 40 by the normal plasma CVD method. Accordingly, the dielectric film 40 has a composition not containing argon. As a result, the dielectric film 40 may include argon concentration lower than the argon concentration of the dielectric member 30.

Forming the dielectric film 40 by the plasma CVD method enables the dielectric film 40 to contain hydrogen abundantly. Interposition of the dielectric member 30 between the dielectric film 40 containing hydrogen abundantly and the light shielding member 20 makes it possible to efficiently supply hydrogen from the second part 42 overlapping the shielding member 20 out of the dielectric film 40, to the substrate 1. The dielectric member 30 that includes low nitrogen concentration and high argon concentration as compared with the dielectric film 40, is improved in hydrogen transparency as compared with the dielectric film 40. As described above, increasing supply of hydrogen to the substrate 1 makes it possible to reduce a dark current in the photoelectric conversion area. Further, adopting the similar configuration also in a peripheral circuit area makes it possible to prevent deterioration of transistor characteristics caused by hot carriers in the peripheral circuit area.

The dielectric member 30 may be formed by patterning on the light shielding film for formation of the light shielding member 20, before patterning of the light shielding member 20. The light shielding film may be etched with use of, as a hard mask, the dielectric member 30 that has been patterned on the light shielding film, to form the light shielding member 20 and the dielectric member 30. In this case, the dielectric member 30 is disposed only on the top surface 202 of the light shielding member 20, and is not disposed on the side surface 203 of the light shielding member 20 and on the photoelectric conversion portion 2. The inclined region 343 of such a dielectric member 30 may be formed before, during, or after patterning of the light shielding film.

Although the front-side illumination photoelectric conversion device APR has been described, the plurality of wiring layers 12, 15, and 18 may be disposed on a side opposite to the main surface 101 of the substrate 1 to configure a back-side illumination photoelectric conversion device APR. This makes it possible to reduce the distance between the light shielding member 20 and the substrate 1, and to improve oblique incidence characteristics.

Figure 4:
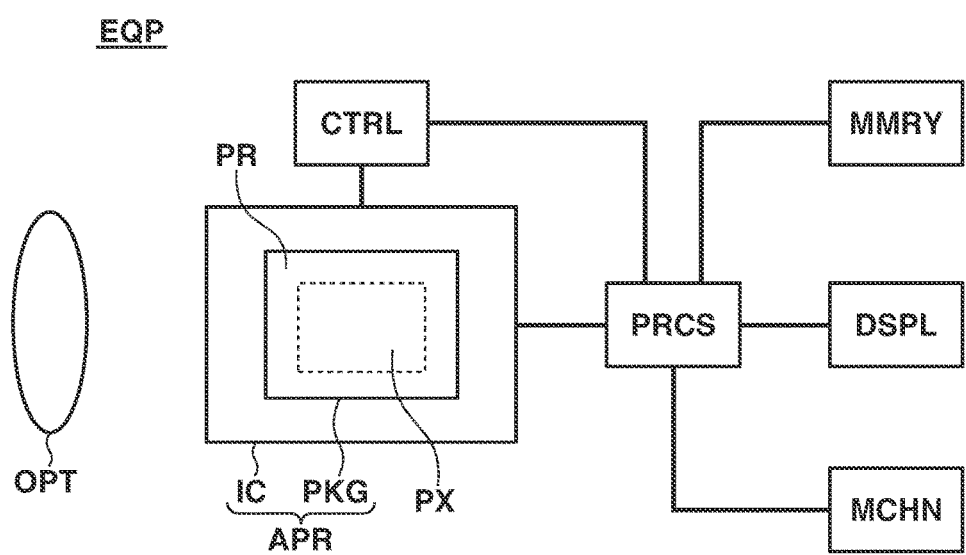
FIG. 4 is a diagram schematically illustrating an example of an apparatus including the photoelectric conversion device.

FIG. 4 illustrates an example of a configuration of an apparatus EQP including the photoelectric conversion device APR. A semiconductor chip IC including the photoelectric conversion area PX may further include a peripheral circuit region PR in which peripheral circuits are provided. The peripheral circuits may be provided in a different semiconductor chip. The semiconductor chip including the peripheral circuits and the semiconductor chip including the photoelectric conversion area PX may be stacked.

The semiconductor device APR may include a package PKG that houses the semiconductor chip IC, in addition to the semiconductor chip IC including the substrate 1. The package PKG may include a base to which the semiconductor chip IC is fixed, a lid made of, for example, glass and faces the semiconductor chip IC, and a connection member that connects a terminal provided on the base and a terminal provided on the semiconductor chip IC, such as a bonding wire and a bump.

The apparatus EQP may further include at least one of an optical system OPT, a control device CTRL, a processing device PRCS, a display device DSPL, and a memory device MMRY. The optical system OPT forms an image on the photoelectric conversion device APR, and examples thereof include a lens, a shutter, and a mirror. The control device CTRL controls the photoelectric conversion device APR, and is a semiconductor device such as an application specific integrated circuit (ASIC). The processing device PRCS processes a signal output from the photoelectric conversion device APR, and is a processing device such as a central processing unit (CPU) and an ASIC to configure an analog front end (AFE) or a digital front end (DFE). The display device DSPL is an electroluminescent (EL) display device or a liquid crystal display device for displaying information (image) obtained in the photoelectric conversion device APR. The memory device MMRY is a magnetic device or a semiconductor device for holding the information (image) obtained in the photoelectric conversion device APR. Examples of the memory device MMRY include volatile memories such as a static random access memory (SRAM) and a dynamic random access memory (DRAM), and non-volatile memories such as a flash memory and a hard disk drive. A mechanical device MCHN includes a movable unit or a driving unit such as a motor and an engine.

The apparatus EQP illustrated in FIG. 4 may be an electronic apparatus such as an information terminal with an imaging function, and a camera. The mechanical device MCHN in the camera can drive parts of the optical system OPT. Further, the apparatus EQP may be a transport apparatus such as a vehicle, a vessel, and an air vehicle. The mechanical device MCHN in the transport apparatus may be used as a moving device. The apparatus EQP as the transport apparatus is suitable to transport the photoelectric conversion device APR, or to perform assist and/or automation of operation (manipulation) with use of an imaging function. The processing device PRCS for assist and/or automation of the operation (manipulation) may perform processing to operate the mechanical device MCHN as the moving device, based on the information obtained in the photoelectric conversion device APR.

Using the photoelectric conversion device APR according to the present exemplary embodiment makes it possible to suppress occurrence of stray light caused by reflection on the light shielding member 20, with respect to strong light such as sun light and a head light of a vehicle. Accordingly, when the photoelectric conversion device APR is installed in the transport apparatus to perform imaging of outside of the transport apparatus and measurement of outside environment, it is possible to obtain excellent image quality and measurement accuracy. Consequently, in manufacturing and selling of the transport apparatus, determination of installation of the photoelectric conversion device APR according to the present exemplary embodiment in the transport apparatus is advantageous to enhance performance of the transport apparatus.

The above-described exemplary embodiment may be appropriately modified without departing from the technical idea. The disclosed contents of the present exemplary embodiment are not limited to those described in the present specification, and contain all matters recognizable from the drawings accompanied to the present specification.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-037713, filed Feb. 28, 2017, which is hereby incorporated by reference herein in its entirety.

What is claimed is:

1. A photoelectric conversion device, comprising:
a substrate including a photoelectric conversion area in which a plurality of photoelectric conversion portions are arranged along a main surface;
a film that is disposed on the photoelectric conversion area, and includes an inner surface on a side of the substrate and an outer surface on a side opposite to the side of the substrate;
a first member that is disposed between the film and the photoelectric conversion area, includes a bottom surface located on the side of the substrate, a top surface located on the side opposite to the side of the substrate, and a side surface connecting the bottom surface and the top surface, and includes a light shielding body;
a second member disposed at least between the film and the top surface; and
a color filter that is disposed above the substrate so that the film is arranged between the color filter and a photoelectric conversion portion in the photoelectric conversion area,
wherein a distance from the main surface to the top surface is smaller than a distance from the main surface to the color filter,
wherein the film includes a first part, a second part, and a third part, the first part overlapping at least a part of each of the photoelectric conversion portions in a normal direction to the main surface of the substrate, the second part overlapping the top surface in the normal direction, and the third part locating between the first part and the second part,
wherein a distance from the main surface to the inner surface at the first part is smaller than the distance from the main surface to the top surface, a distance from the main surface to the outer surface at the first part is smaller than a distance from the main surface to the outer surface at the second part, and the outer surface at the third part inclines to the top surface,
wherein a front surface of the second member on a side of the film inclines to the top surface, between the film and the top surface in the normal direction, and
wherein one or both of the following (A) and (B) are satisfied,
(A) the second member has a refractive index lower than a refractive index of the film, and
(B) the film and the second member each include a silicon compound, and the second member includes lower nitrogen concentration and/or higher oxygen concentration as compared with the film.

2. The photoelectric conversion device according to claim 1, wherein the outer surface inclines to the top surface at a position overlapping the first member in the normal direction.

3. The photoelectric conversion device according to claim 2, wherein the outer surface at the second part spreads along the top surface.

4. The photoelectric conversion device according to claim 1, wherein the film is a multilayer film that includes a first layer, a second layer larger in thickness than the first layer, and a third layer smaller in thickness than the second layer, the second layer is between the first layer and the third layer, the first layer configures the inner surface, and the third layer configures the outer surface.

5. The photoelectric conversion device according to claim 4, wherein the second member includes a fourth part locating between the film and the top surface in the normal direction, and a thickness of the second member at the fourth part in the normal direction is smaller than a thickness of the film at the second part in the normal direction.

6. The photoelectric conversion device according to claim 4, wherein the top surface includes titanium or a titanium compound, and the side surface includes aluminum.

7. An apparatus provided with the photoelectric conversion device according to claim 4, the apparatus comprising at least one of an optical system configured to form an image on the photoelectric conversion device, a control device configured to control the photoelectric conversion device, a processing device configured to process a signal output from the photoelectric conversion device, a display device configured to display information obtained in the photoelectric conversion device, and a memory device configured to store the information obtained in the photoelectric conversion device.

8. A photoelectric conversion device, comprising:
a substrate including a photoelectric conversion area in which a plurality of photoelectric conversion portions are arranged along a main surface;
a film that is disposed on the photoelectric conversion area, and includes an inner surface on a side of the substrate and an outer surface on a side opposite to the side of the substrate;
a first member that is disposed between the film and the photoelectric conversion area, includes a bottom surface located on the side of the substrate, a top surface located on the side opposite to the side of the substrate, and a side surface connecting the bottom surface and the top surface, and includes a light shielding body; and
a second member disposed at least between the film and the top surface,
wherein the film includes a first part, a second part, and a third part, the first part overlapping at least a part of each of the photoelectric conversion portions in a normal direction to the main surface of the substrate, the second part overlapping the top surface in the normal direction, and the third part locating between the first part and the second part,
wherein a distance from the main surface to the inner surface at the first part is larger than a distance from the main surface to the bottom surface and is smaller than a distance from the main surface to the top surface,
wherein a distance from the main surface to the outer surface at the first part is smaller than a distance from the main surface to the outer surface at the second part, and the outer surface at the third part inclines to the top surface, and
wherein one or both of the following (A) and (B) are satisfied,
(A) the second member has a refractive index lower than a refractive index of the film, and
(B) the film and the second member each include a silicon compound, and the second member includes lower nitrogen concentration and/or higher oxygen concentration as compared with the film.

9. The photoelectric conversion device according to claim 8, wherein a front surface of the second member on a side of the film inclines to the top surface, between the film and the top surface in the normal direction, and wherein the second member includes a fourth part locating between the film and the top surface in the normal direction, and a thickness of the second member at the fourth part in the normal direction is equal to or larger than one-fourth of a width of the top surface.

10. The photoelectric conversion device according to claim 8, wherein the second member includes a fourth part locating between the film and the top surface in the normal direction, and a thickness of the second member at the fourth part in the normal direction is larger than twice a distance from the side surface to the inner surface at the third part.

11. The photoelectric conversion device according to claim 8, wherein the second member includes a fifth part locating between the side surface and the third part, and a sixth part locating between the first part and the corresponding photoelectric conversion portion, and wherein a thickness of the second member at the fifth part in a direction perpendicular to the side surface is smaller than a half of a thickness of the second member at the sixth part in the normal direction.

12. The photoelectric conversion device according to claim 9, wherein the distance from the main surface to the outer surface at the first part is smaller than a distance from the main surface to the inner surface at the second part.

13. The photoelectric conversion device according to claim 11, wherein a difference between the distance from the main surface to the outer surface at the first part and the distance from the main surface to the top surface is smaller than a half of a distance from the bottom surface to the top surface.

14. The photoelectric conversion device according to claim 10, wherein a thickness of the film at the second part in the normal direction is smaller than a thickness of the first member in the normal direction.

15. The photoelectric conversion device according to claim 10, wherein a distance from the top surface to the outer surface at the second part is smaller than a thickness of the first member in the normal direction.

16. The photoelectric conversion device according to claim 15, wherein a distance from the main surface to the sixth part is smaller than the distance from the main surface to the bottom surface.

17. The photoelectric conversion device according to claim 8, wherein the film is a multilayer film including a first layer and a second layer that is larger in thickness than the first layer, and the first layer configures the inner surface.

18. The photoelectric conversion device according to claim 17, wherein the first layer and the second layer each include a silicon compound, and the second layer includes nitrogen concentration higher than nitrogen concentration of the first layer.

19. The photoelectric conversion device according to claim 8, wherein the film and the second member each include a silicon compound, and the second member includes argon concentration higher than argon concentration of the film.

20. An apparatus provided with a mechanical device, comprising:

the photoelectric conversion device according to claim 10; and a processing device configured to perform processing to operate the mechanical device, based on information obtained in the photoelectric conversion device.

* * * * *